(12) United States Patent
Hatcher

(10) Patent No.: US 8,278,137 B2
(45) Date of Patent: Oct. 2, 2012

(54) ELECTROLUMINESCENT DEVICES COMPRISING BUS BARS

(75) Inventor: Michael Hatcher, Suffolk (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 288 days.

(21) Appl. No.: 12/742,226

(22) PCT Filed: Nov. 6, 2008

(86) PCT No.: PCT/GB2008/003742
§ 371 (c)(1),
(2), (4) Date: May 24, 2010

(87) PCT Pub. No.: WO2009/060196
PCT Pub. Date: May 14, 2009

(65) Prior Publication Data
US 2011/0101313 A1    May 5, 2011

(30) Foreign Application Priority Data

Nov. 9, 2007    (GB) .................................. 0722078.3

(51) Int. Cl.
*H01L 51/40*    (2006.01)
(52) U.S. Cl. .......................................... 438/99; 257/40
(58) Field of Classification Search .................. 438/99; 257/40
See application file for complete search history.

(56) References Cited

U.S. PATENT DOCUMENTS

| | | | |
|---|---|---|---|
| 4,539,507 A | 9/1985 | VanSlyke et al. | 313/504 |
| 5,703,436 A | 12/1997 | Forrest et al. | 313/506 |
| 5,707,745 A | 1/1998 | Forrest et al. | 428/432 |
| 6,664,730 B2 | 12/2003 | Weaver | 313/504 |
| 2004/0056591 A1 | 3/2004 | Koo et al. | 313/506 |
| 2005/0194890 A1 | 9/2005 | Koo et al. | 313/503 |
| 2006/0019573 A1 | 1/2006 | Koo et al. | 445/24 |

FOREIGN PATENT DOCUMENTS

| | | |
|---|---|---|
| EP | 0 880 303 B1 | 11/1997 |
| EP | 1 191 823 B1 | 3/2002 |
| EP | 1 724 854 A1 | 11/2006 |
| WO | WO 90/13148 | 11/1990 |
| WO | WO 95/06400 | 3/1995 |
| WO | WO 99/21935 | 5/1999 |

(Continued)

OTHER PUBLICATIONS

Bernius et al., "Progress with Light-Emitting Polymers," *Adv. Mater.*, 12(23):1737-1750 (2000).

(Continued)

*Primary Examiner* — Douglas Menz
(74) *Attorney, Agent, or Firm* — Marshall, Gerstein & Borun LLP

(57) ABSTRACT

A method for manufacturing an organic semiconductor device having a plurality of pixels, said method comprising: providing a substrate comprising a patterned layer of well-defining banks (308); depositing a first conductive material (310, 312) in the wells and over the well-defining banks (308), the first conductive material forming first electrodes (310) in the wells and bus-bars (312) over the well-defining banks (308) with an electrical break therebetween; depositing an organic semiconductive layer (318) over the first electrodes (310) in the wells; and depositing a second conductive material (320) over both the organic semiconductive layer (318) and the bus-bars (312) forming a continuous second electrode (320) over the organic semiconductive layer (318) and the bus-bars (312).

23 Claims, 3 Drawing Sheets

FOREIGN PATENT DOCUMENTS

| WO | WO 00/55927 | 9/2000 |
| WO | WO 01/16251 | 3/2001 |
| WO | WO 02/067343 | 8/2002 |
| WO | WO 2006/123126 | 11/2006 |

OTHER PUBLICATIONS

Bharathan et al., "Polymer Electroluminescent Devices Processed by Inkjet Printing: I. Polymer Light-Emitting Logo," *Appl. Phys. Lett.*, 72:2660-2662 (1998).

Burrow et al., "Semitransparent Cathodes for Organic Light Emitting Devices," *J. Appl. Phys.*; , 87:3080 (2000).

Chang et al., "Dual-Color Polymer Light-emitting Pixels Processed by Hybrid Inkjet Printing," *Appl. Phys. Lett.*, 73:2561 (1998).

Grice et al., "High Brightness and Efficiency Blue Light-Emitting Polymer Diodes," *Appl. Phys. Lett.*, 73:629-631 (1998).

Gu et al., "Transparent Organic Light Emitting Devices," *Appl. Phys. Lett.*, 68:2606 (1996).

Kim et al., "Improved Operational Stability of Polyfiuorene-Based Organic Light-Emitting Diodes With Plasma-Treated Indium-Tin-Oxide Anodes," *Appl. Phys. Lett.*, 74:3084 (1999).

Service, "Self-Assembled LEDs Shine Brightly," *Science*, 279(5354):1135 (1998).

Combined Search and Examination Report for GB0722078.3, dated Mar. 26, 2008.

Examination Report for GB0722078.3, dated Sep. 21, 2009.

International Search Report for PCT/GB2008/003742, dated Feb. 18, 2009.

Written Opinion of the International Searching Authority for PCT/GB2008/003742, dated Feb. 18, 2009.

ELECTROLUMINESCENT DEVICES COMPRISING BUS BARS

FIELD OF THE INVENTION

The present invention relates to electroluminescent devices comprising bus-bars and methods for the manufacture thereof. Embodiments of the present invention relate to top-emitting devices having transparent cathodes with enhanced lateral conductivity and methods for the manufacture thereof.

BACKGROUND TO THE INVENTION

Displays fabricated using OLEDs (organic light emitting devices) provide a number of advantages over other flat panel technologies. They are bright, colourful, fast-switching, provide a wide viewing angle, and are easy and cheap to fabricate on a variety of substrates. Organic (which here includes organometallic) light emitting diodes (LEDs) may be fabricated using materials including polymers, small molecules and dendrimers, in a range of colours which depend upon the materials employed. Examples of polymer-based organic LEDs are described in WO 90/13148, WO 95/06400 and WO 99/48160. Examples of dendrimer-based materials are described in WO 99/21935 and WO 02/067343. Examples of so called small molecule based devices are described in U.S. Pat. No. 4,539,507.

A typical OLED device comprises two layers of organic material, one of which is a layer of light emitting material such as a light emitting polymer (LEP), oligomer or a light emitting low molecular weight material, and the other of which is a layer of a hole injection material such as a polythiophene derivative or a polyaniline derivative.

OLEDs may be deposited on a substrate in a matrix of pixels to form a single or multi-colour pixellated display. A multicoloured display may be constructed using groups of red, green, and blue emitting pixels. So-called active matrix displays have a memory element, typically a storage capacitor and a thin film transistor (TFT), associated with each pixel whilst passive matrix displays have no such memory element and instead are repetitively scanned to give the impression of a steady image. Other passive displays include segmented displays in which a plurality of segments share a common electrode and a segment may be lit up by applying a voltage to its other electrode. A simple segmented display need not be scanned but in a display comprising a plurality of segmented regions the electrodes may be multiplexed (to reduce their number) and then scanned.

FIG. 1 shows a vertical cross section through an example of an OLED device 100. In an active matrix display part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic or some other substantially transparent material. An anode layer 104 is deposited on the substrate, typically comprising around 40 to 150 nm thickness of ITO (indium tin oxide), over part of which is provided a metal contact layer. Typically the contact layer comprises around 500 nm of aluminium, or a layer of aluminium sandwiched between layers of chrome, and this is sometimes referred to as anode metal. Glass substrates coated with ITO and contact metal are widely available. The contact metal over the ITO helps provide reduced resistance pathways where the anode connections do not need to be transparent, in particular for external contacts to the device. The contact metal is removed from the ITO where it is not wanted, in particular where it would otherwise obscure the display, by a standard process of photolithography followed by etching.

A substantially transparent hole injection layer 106 is deposited over the anode layer, followed by an electroluminescent layer 108, and a cathode 110. The electroluminescent layer 108 may comprise, for example, a PPV (poly(p-phenylenevinylene)) and the hole injection layer 106, which helps match the hole energy levels of the anode layer 104 and electroluminescent layer 108, may comprise a conductive transparent polymer, for example PEDOT:PSS (polystyrenesulphonate-doped polyethylene-dioxythiophene) from H. C. Starck of Germany. In a typical polymer-based device the hole injection layer 106 may comprise around 200 nm of PEDOT. The light emitting polymer layer 108 is typically around 70 nm in thickness. These organic layers may be deposited by spin coating (afterwards removing material from unwanted areas by plasma etching or laser ablation) or by inkjet printing. In this latter case, banks 112 may be formed on the substrate, for example using photoresist, to define wells into which the organic layers may be deposited. Such wells define light emitting areas or pixels of the display.

Cathode layer 110 typically comprises a low work function metal such as calcium or barium (for example deposited by physical vapour deposition) covered with a thicker, capping layer of aluminium. Optionally an additional layer may be provided immediately adjacent the electroluminescent layer, such as a layer of lithium fluoride, for improved electron energy level matching. Mutual electrical isolation of cathode lines may be achieved or enhanced through the use of cathode separators (not shown in FIG. 1).

The same basic structure may also be employed for small molecule devices.

Typically a number of displays are fabricated on a single substrate and at the end of the fabrication process the substrate is scribed, and the displays separated before an encapsulating can is attached to each to inhibit oxidation and moisture ingress. Alternatively, the displays can be encapsulated prior to scribing and separating.

To illuminate the OLED, power is applied between the anode and cathode by, for example, battery 118 illustrated in FIG. 1. In the example shown in FIG. 1 light is emitted through transparent anode 104 and substrate 102 and the cathode is generally reflective. Such devices are referred to as "bottom emitters". Devices which emit through the cathode ("top emitters") may also be constructed, for example, by keeping the thickness of cathode layer 110 less than around 50-100 nm so that the cathode is substantially transparent and/or using a transparent cathode material such as ITO.

Referring now to FIG. 1b, this shows a simplified cross-section through a passive matrix OLED display device 150, in which like elements to those of FIG. 1 are indicated by like reference numerals. As shown, the hole injection layer 106 and the electroluminescent layer 108 are subdivided into a plurality of pixels 152 at the intersection of mutually perpendicular anode and cathode lines defined in the anode metal 104 and cathode layer 110 respectively. In the figure conductive lines 154 defined in the cathode layer 110 run into the page and across-section through one of a plurality of anode lines 158 running at right angles to the cathode lines is shown. An electroluminescent pixel 152 at the intersection of a cathode and anode line may be addressed by applying a voltage between the relevant lines. The anode metal layer 104 provides external contacts to the display 150 and may be used for both anode and cathode connections to the OLEDs (by running the cathode layer pattern over anode metal lead-outs).

The above mentioned OLED materials, and in particular the light emitting polymer material and the cathode, are susceptible to oxidation and to moisture. The device is therefore encapsulated in a metal or glass can 111, attached by UV-curable epoxy glue 113 onto anode metal layer 104. Preferably the anode metal contacts are thinned where they pass under the lip of the metal can 111 to facilitate exposure of glue 113 to UV light for curing.

Considerable effort has been dedicated to the realization of a full-colour, all plastic screen. The major challenges to achieving this goal have been: (1) access to conjugated polymers emitting light of the three basic colours red, green and blue; and (2) the conjugated polymers must be easy to process and fabricate into full-colour display structures. Polymer light emitting devices (PLEDs) show great promise in meeting the first requirement, since manipulation of the emission colour can be achieved by changing the chemical structure of the conjugated polymers. However, while modulation of the chemical nature of conjugated polymers is often easy and inexpensive on the lab scale it can be an expensive and complicated process on the industrial scale. The second requirement of easy processability and build-up of full-colour matrix devices raises the question of how to micro-pattern fine multicolour pixels and how to achieve full-colour emission. Inkjet printing and hybrid inkjet printing technology have attracted much interest for the patterning of PLED devices (see, for example, Science 1998, 279, 1135; Wudl et al, Appl Phys. Lett. 1998, 73, 2561; and J. Bharathan, Y. Yang, Appl. Phys. Lett. 1998, 72, 2660).

In order to contribute to the development of a full-colour display, conjugated polymers exhibiting direct colour-tuning, good processability and the potential for inexpensive large-scale fabrication have been sought. Poly-2,7-fluorenes have been the subject of much research into blue-light emitting polymers (see, for example, A. W. Grice, D. D. C. Bradley, M. T. Bernius, M. Inbasekaran, W. W. Wu, and E. P. Woo, Appl. Phys. Lett. 1998, 73, 629; J. S. Kim, R. H. Friend, and F. Cacialli, Appl. Phys. Lett. 1999, 74, 3084; WO-A-00/55927 and M. Bernius et al, Adv. Mater., 2000, 12, No. 23, 1737).

Active matrix organic light-emitting devices (AMOLEDs) are known in the art wherein electroluminescent pixels and a cathode are deposited onto a glass substrate comprising active matrix circuitry for controlling individual pixels and a transparent anode. Light in these devices is emitted towards the viewer through the anode and the glass substrate (so-called bottom-emission). Devices with transparent cathodes (so-called "top-emitting" devices) have been developed as a solution to this problem. A transparent cathode must possess the following properties: transparency; conductivity; and low workfunction for efficient electron injection into the LUMO of the electroluminescent layer of the device or, if present, an electron transporting layer.

An Example of a top-emitting device is shown in FIG. 2. The top-emitting device comprises a substrate 202 on which an insulating planarization layer 204 is disposed. A via hole is provided in the planarization layer 204 so an anode can be connected to its associated TFT (not shown). An anode 206 is disposed on the planarization layer 204 over which well-defining banks 208 are provided. The anode 206 is preferably reflective. Electroluminescent material 210 is disposed in the wells defined by the banks and a transparent cathode 212 is deposited over the wells and the banks to form a continuous layer.

However, there are very few conductive materials that are transparent at anything above very low thicknesses. One such material is indium tin oxide (ITO), and thus examples of transparent cathodes disclosed in the art include MgAg/ITO disclosed in Appl. Phys. Lett 68, 2606, 1996 and Ca/ITO disclosed in J. Appl. Phys. 87, 3080, 2000.

In these examples a first, thin layer of metal (or metal alloy in the case of MgAg) provides electron injection. However, the thinness of this layer is such that lateral conductivity is poor. A layer of ITO is necessary because it retains transparency at higher thicknesses, thus improving lateral conductivity of the cathode.

However, ITO is deposited by the high energy process of sputtering which is likely to cause damage to the layer(s) it is deposited onto. Given this, and the constraints in terms of alternatives to ITO, it would therefore be desirable if the need for a separate layer of transparent conductive material can be obviated.

Bus-bars are a well known method of increasing the conductivity of a conductive layer (see, for example, U.S. Pat. No. 6,664,730), providing a thickening of the metal away from the active region. However, unless these bus-bars are transparent, it will be immediately apparent that their use in top-emitting devices will reduce the emissive area of pixels in the same way that active matrix circuitry does for bottom-emitting AMOLEDs, thus reducing the advantages associated with said devices.

Inkjet printing of electroluminescent formulations is a cheap and effective method of forming patterned devices. As disclosed in EP-A-0880303, this entails use of photolithography to form wells that define pixels into which the electroluminescent material is deposited by inkjet printing. In WO 2006/123126, the present applicant has provided a solution to the problem of trying to enhance the conductivity of these thin transparent cathode layers in top-emitting devices without reducing emissive area of pixels by utilising the well-defining resist banks to provide structures on which a patterned metal layer can be deposited to give bus-bars.

A layer of metal on the top surface of the well-defining layer provides bus-bars that are able to enhance the conductivity of the transparent cathode layer which it is in contact with. Because the bus-bars provided by this metal layer are disposed on areas of the device that are already non-emissive due to the presence of the well-defining banks, the conductivity of the transparent cathode layer is enhanced without reducing the emissive area of the pixels.

In the method for manufacturing a top-emitting display described in WO 2006/123126, an anode layer is deposited on a substrate, well-defining bank material is deposited over the anode layer, and metal material for the bus-bars is deposited over the well-defining banks. The bank material and the metal material are patterned such that the metal forming the bus-bars is only located on the tops of the banks. Organic electroluminescent material can then be deposited in the wells over the anode material and a transparent cathode is then deposited over the electroluminescent material and the bus-bars on top of the banks.

It is an aim of the present invention to provide an alternative to the invention described in WO 2006/123126.

SUMMARY OF THE INVENTION

In the arrangement described in WO 2006/123126, the metal layer forming the bus-bars is patterned such that it is only disposed on the top of the well-defining banks. However, the applicant has realized that such patterning will not be required if the metal material forming the bus-bars is also used as the anode layer of the OLED.

Thus, in accordance with a first aspect of the present invention, there is provided a method for manufacturing an organic semiconductor device having a plurality of pixels, said method comprising: providing a substrate comprising a patterned layer of well-defining banks; depositing a first conductive material in the wells and over the well-defining banks, the first conductive material forming first electrodes in the wells and bus-bars over the well-defining banks with an electrical break therebetween; depositing an organic semiconductive layer over the first electrodes in the wells; and depositing a second conductive material over both the organic semiconductive layer and the bus-bars forming a continuous second electrode over the organic semiconductive layer and the bus-bars.

According to a second aspect of the present invention there is provided an organic semiconductor device having a plurality of pixels, said device comprising: a substrate comprising a patterned layer of well-defining banks; a layer of first conductive material in the wells and over the well-defining banks, the first conductive material forming first electrodes in the wells and bus-bars over the well-defining banks with an electrical break therebetween; an organic semiconductive layer over the first electrodes in the wells; and a layer of second conductive material over both the organic semiconductive layer and the bus-bars, the second conductive material forming a continuous second electrode over the organic semiconductive layer and the bus-bars.

Preferably the first electrodes are reflective and the second electrode is transparent in order to form a top-emitting device. The first electrodes may be anodes and the second electrode may be a cathode. In such an arrangement, the transparent cathode may comprise any low work-function conductive material that will allow the passage of at least some light through it. For example, the transparent cathode may have a light transmissivity of at least 30%, preferably a light transmissivity of at least 50%, more preferably a light transmissivity of at least 60%, and most preferably a light transmissivity of at least 80%. The transparent cathode may comprise a single layer of conductive material or a plurality of layers.

Particularly preferred transparent cathode arrangements include a low work-function metal sufficiently thin to be transparent in contact with the organic semiconductive layer. Preferred low work-function materials have a work-function of no more than 3.5 eV, preferably no more than 3.2 eV, most preferably no more than 3.0 eV. Alkaline earth metals having work-functions in this range, in particular barium or calcium, are particularly preferred. Thin low work-function materials may be deposited by relatively low energy processes such as thermal or electron beam evaporation that do not cause any damage to organic semiconductive layer.

Another preferred transparent cathode arrangement includes a thin layer of dielectric material capped with a thin metal layer. Preferred dielectric materials are metal oxides or fluorides, preferably fluorides. Preferred metal cations are alkaline or alkaline earth metals. Particularly preferred are fluorides of lithium, sodium, calcium and barium. Any thin metal layer may serve to cap the dielectric layer provided it retains its transparency, for example aluminium.

Typically, if suitably chosen, cathode layers may remain transparent up to 20 nm. Preferred thicknesses will depend upon the identity of the cathode material itself. For example, a light transmissivity of 30% or above can be attained by forming a Mg—Al alloy at a thickness of 14 nm. Examples of suitable transparent cathode materials are well known to those skilled in the art and are disclosed in, for example, U.S. Pat. Nos. 5,703,436 and 5,707,745.

The material used for forming the well-defining bank layer may be deposited on the substrate by any suitable technique known to those skilled in the art, e.g. spin coating. The thickness of the well-defining layer is such that it is sufficient to define the boundaries of the wells into which a solution of an organic semiconductive material is deposited by means of an ink jet printing process but not so high that there is significant danger of the second electrode breaking at boundaries between the wells and the banks. The second electrode should form a continuous layer over the pixels of the display. Thus, typically the well-defining layer is at least 1.5 times the thickness of the first electrodes, preferably at least 2 times the thickness of the first electrodes in order to ensure that there is an electrical break between the first electrodes and the bus-bars. Furthermore, the well-defining layer is typically less than 30 times the thickness of the first electrodes in order to ensure than the second electrode forms a continuous layer with no electrical break between the material over the organic semiconductive layer and the material over the bus-bars on the banks. Where the well-defining layer is a photoresist layer, it may be formed from any photoresist material, examples of which include photosensitive polyimides and the like (see, for example, EP-A-0880303).

In addition to the requirement that the bank structure should prevent the second electrode breaking at boundaries between the wells and the banks, a further requirement is that contact should be broken between the first electrodes in the wells and the bus-bars on the banks.

One way of achieving both requirements for the well-defining bank layer may be to tune the height and slope of the well-defining bank layer such that contact between the first electrodes and the bus-bars is broken while the second electrode is retained in a continuous layer. There will be a bigger differential in height between the first electrode and the top of the banks when compared to the difference in height between the second electrode over the wells and the top of the banks as the second electrode is deposited after filling the well with organic semiconductive material and optionally other layers such as charge injection and transport layers. As such, the height of the well-defining bank layer may be tuned to break the first conductive layer at boundaries between the wells and the banks while retaining a continuous layer for the second conductive material.

Another way of achieving both requirements for the well-defining bank layer is to form a double bank structure comprising a first bank which has an undercut structure. That is, the walls of the first bank have a negative profile such that the angle between the perpendicular to the substrate and said walls is less than 0°. The bus-bars are disposed on top of the first bank and a second bank which has a positive slope into the wells is disposed thereover. The undercut structure of the first bank ensures that there is a break between the first conductive material forming the first electrodes and the first conductive material forming the bus-bars. The positive slope of the second bank ensures that there is a continuous electrical connection between the second conductive material over the bank and the second conductive material over the well. That is, the walls of the second bank have a positive profile such that the angle between the perpendicular to the substrate and said walls is greater than 0°. This helps to ensure continuity in the second electrode layer.

The organic semiconductive layer can comprise one or more organic light emitting materials. Where there is more than one organic light emitting material, these can be disposed as separate, discrete layers or as mixtures of said materials in a single layer. Any organic light emitting materials can be used with embodiments of the present invention. Suitable examples include: conjugated polymers including poly (arylene vinylenes) such as poly-phenylene-vinylene (PPV) and derivatives thereof (see, for example, WO-A-90/13148); polyfluorene derivatives (see, for example, A. W. Grice, D. D. C. Bradley, M. T. Bernius, M. Inbasekaran, W. W. Wu, and E. P. Woo, Appl. Phys. Lett. 1998, 73, 629, WO-A-00/55927 and Bernius et al, Adv. Materials, 2000, 12, No. 23, 1737), particularly 2,7-linked 9,9 dialkyl polyfluorenes or 2,7-linked 9,9 diaryl polyfluorenes; polyspirofluorenes, particularly 2,7-linked poly-9,9-spirofluorene; polynaphthylene derivatives, polyindenofluorene derivatives, particularly 2,7-linked polyindenofluorenes; and polyphenanthrenyl derivatives. Organic semiconductive material is preferably deposited by inkjet printing into the wells defined by the well-defining layer. An inkjet composition used to deposit electroluminescent material comprises at least one solvent, at least one electroluminescent material and optional additives (e.g. additives for modifying viscosity, boiling point, etc. of the composition). Suitable electroluminescent compositions for inkjet printing will be apparent to the skilled person as disclosed in, for example, EP 0880303 and WO 01/16251. Suitable solvents include, for example, alkyl or alkoxy substituted benzenes, in particular polyalkylbenzenes wherein two or more alkyl substituents may be linked to form a ring.

The precise thickness of the electroluminescent layer or layers will vary depending upon factors such as the identity of the material or materials of the electroluminescent layer or layers and the identity of the other components of the device. However, typically the thickness of the electroluminescent layer (or combined thickness if there is more than one layer) is from 1 to 250 nm, preferably from 50 to 120 nm.

Other active layers such as charge injecting and charge transport layers can be deposited in the wells.

For an active matrix device, the substrate is a planarized active matrix backplane. The planarization layer is an insulating layer of material such as benzo-cyclobutane.

The material which forms the first electrodes and the bus-bars must be conductive enough to perform efficiently as a conductive bus-bar while also acting as a good charge injecting material to act as an efficient electrode. However, these requirements will vary widely depending on, for example, the size of the display (which will determine how conductive the bus-bars should be—a larger display will require longer bus-bars which should therefore be a good conductor) and the type of materials used for the electroluminescent layer and, if present, any charge injecting and/or transport layers.

If the first electrodes are anodes, then the material of the bus-bars and anode should be selected such that it is conductive and also a good hole injecting material.

For a top-emitting device, the first electrode may be reflective or alternatively a separate reflective layer may be provided. For example, a two layer structure may be provided comprising a reflective layer with an anode layer of, for example, ITO disposed thereover. The reflective layer may be a metal or an alloy layer, e.g. Al, Ag or NiCr.

Anode materials are known in the art. Examples of suitable materials include tin-doped indium oxide (ITO), zinc-doped indium oxide (IZO), indium oxide, tin oxide and zinc oxide, of which ITO is particularly preferred. The anode material could instead be a metal material such as aluminium, chromium or an alloy. For a top-emitting device the first electrode may be reflective. The thickness of the anode electrode will vary depending upon the identity of the material and of the other components of the electroluminescent device. Typically, the electrode has a thickness of from 50 to 500 nm, particularly from 50 to 300 nm.

OLEDs are prone to degradation in the presence of moisture and oxygen and it is therefore desirable to provide a transparent encapsulant over the transparent cathode to provide a barrier against ingress of moisture and oxygen. Suitable transparent encapsulants include a layer of glass glued onto the substrate or, a barrier stack comprising alternating layers of plastic and ceramic materials that combine to form a tortuous path for moisture or oxygen ingress. A getter material may also be provided to remove moisture and/or oxygen.

BRIEF SUMMARY OF THE DRAWINGS

The present invention may be further understood by consideration of the following non-limitative example, with reference to the following figures in which.

DETAILED DESCRIPTION OF PREFERRED EMBODIMENTS

Figure 1:
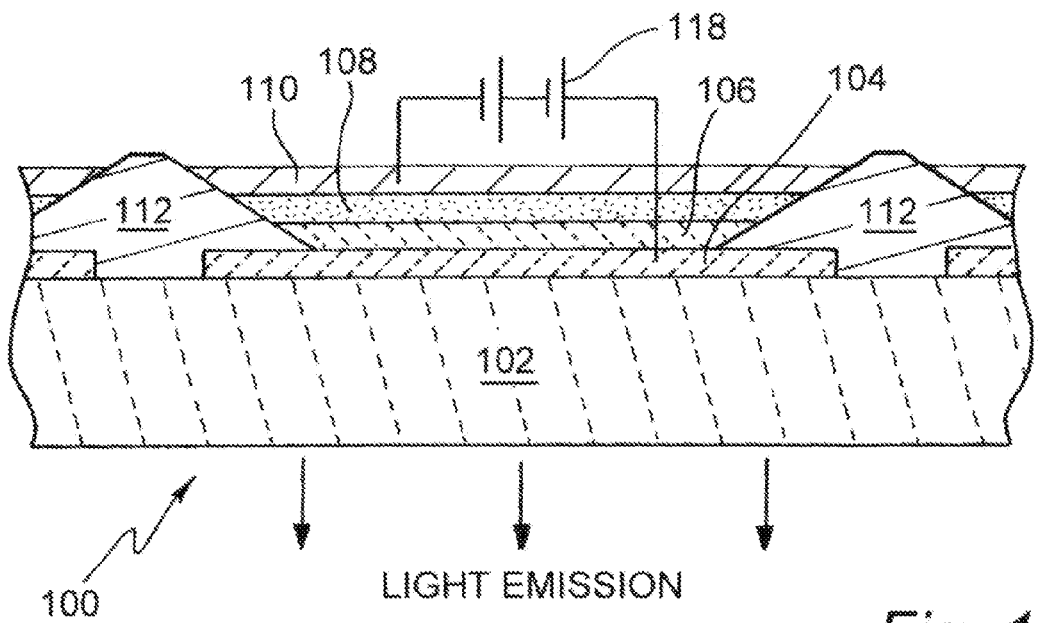
FIG. 1 shows a bottom-emitting organic light emitting device according to the prior art.
Figure 1B:
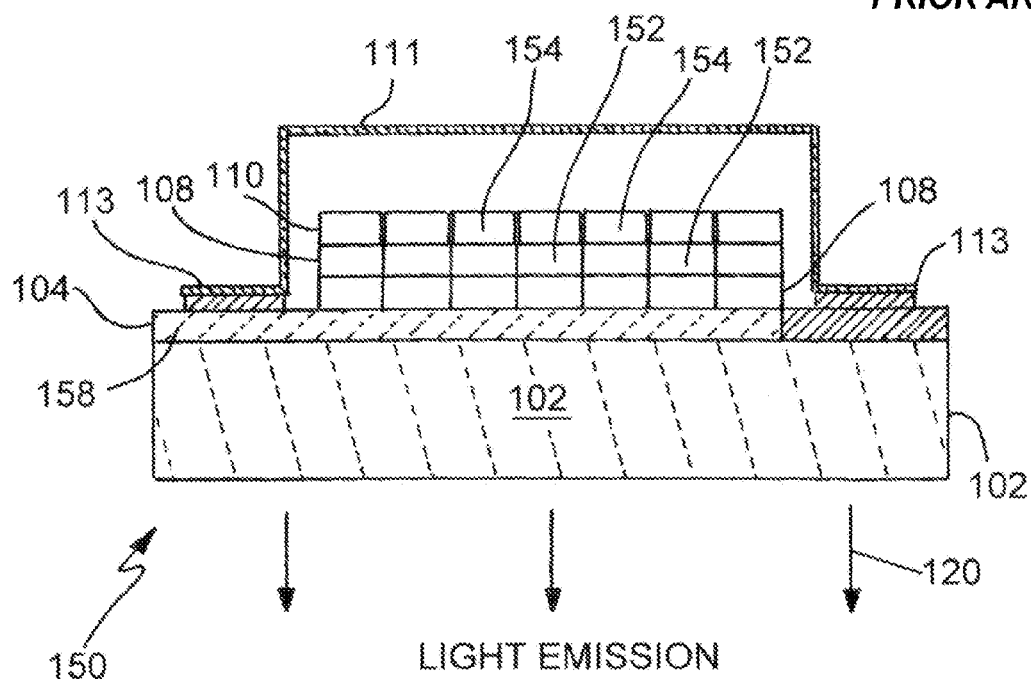
FIG. 1b shows a bottom-emitting organic light emitting display according to the prior art.
Figure 2:
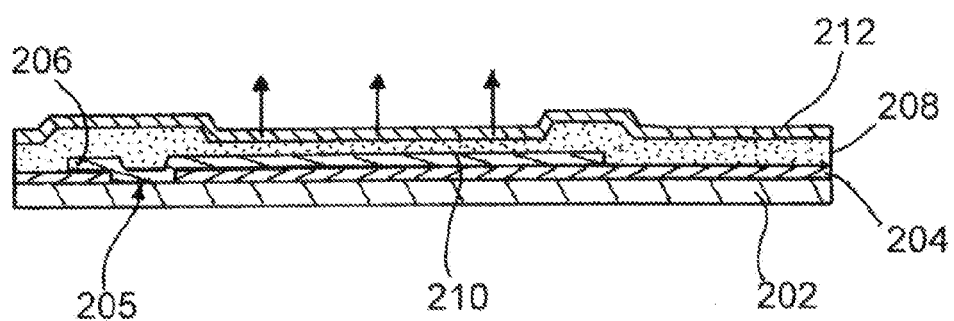
FIG. 2 shows a top-emitting organic light emitting device according to the prior art.
Figure 3:
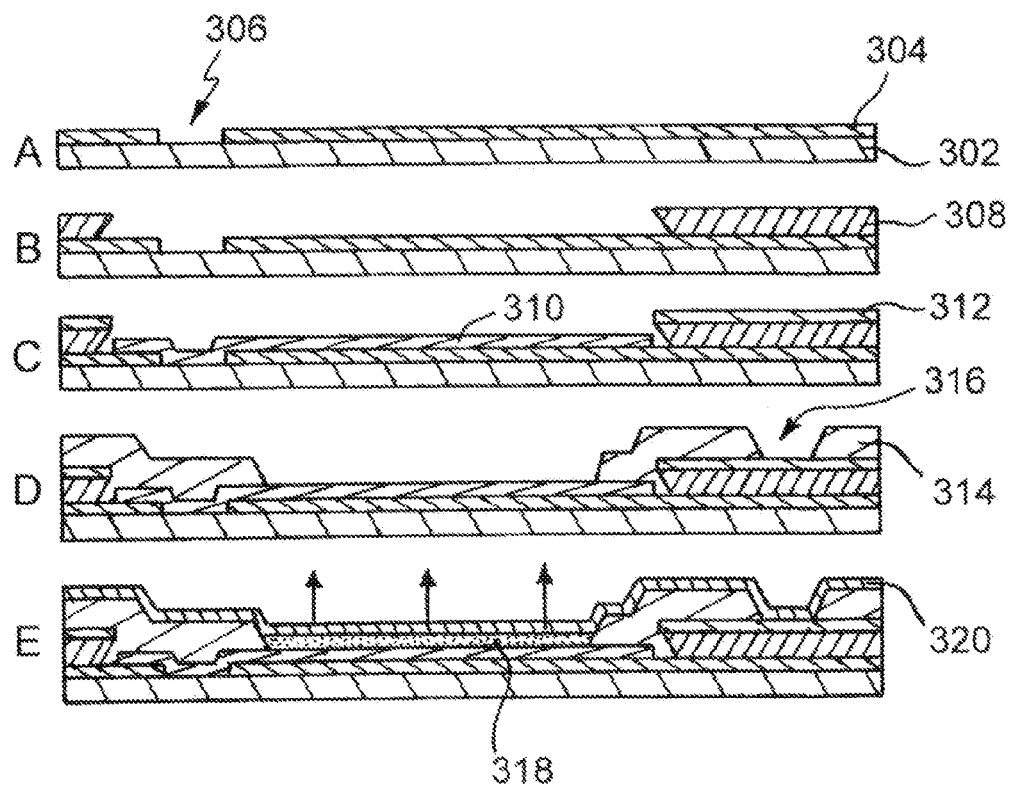
FIGS. 3A to 3E show the steps for constructing a top-emitting organic light emitting device according to an embodiment of the present invention and FIGS. 4A and 4B show a top-emitting device without bus-bars (FIG. 4A) and with bus-bars in accordance with an embodiment of the present invention (FIG. 4B).

The process steps according to an embodiment of the present invention are shown in FIGS. 3A to 3E. First, as shown in FIG. 3A, an active matrix substrate 302 is prepared with a planarization layer 304 and a via hole 306 for each pixel so an anode for each pixel can be connected to its associated TFT (not shown). An insulating well-defining bank layer 308, such as a negative acting I-line resist, with an undercut edge profile is spin-coated onto the substrate and patterned as shown in FIG. 3B. Anode material is deposited onto the substrate, both in the wells forming anodes 310 and over the well-defining banks forming bus-bars 312, via a vacuum deposition process as shown in FIG. 3C. The anodes 310 are substantially thinner than the undercut well-defining bank layer 308 so at the edges of the wells electrical connection between the anodes 310 and the bus-bars 312 is broken as shown in FIG. 3C. A second, positive edged, insulating bank layer 314 is then spun-coated onto the substrate and patterned to form the pixel wells and contact vias 316 to the bus-bars sandwiched between the two bank layers as shown in FIG. 3D. Finally, electroluminescent material 318 is deposited in the pixel wells and a thin transparent cathode 320 is deposited thereover, contacting both the top of the electroluminescent material 318 and the bus-bars 312 as shown in FIG. 3E.

The electroluminescent material 318 is deposited by inkjet printing into the wells. The inkjet composition used to deposit electroluminescent material 318 comprises at least one solvent, at least one electroluminescent material and optional additives (e.g. additives for modifying viscosity, boiling point, etc. of the composition). Components of the electroluminescent compositions for inkjet printing will be apparent to the skilled person as disclosed in, for example, EP 0880303 and WO 01/16251.

Preferred components of the inkjet composition include the following:

Electroluminescent material: conjugated polymers are preferred, including poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene.

Such polymers as disclosed in, for example, Adv. Mater. 2000 12(23) 1737-1750 and references therein.

Solvent: alkyl or alkoxy substituted benzenes, in particular polyalkylbenzenes wherein two or more alkyl substituents may be linked to form a ring.

The transparent cathode may comprise a single layer of conductive metal or a plurality of layers. Particularly preferred transparent cathode arrangements are: a low workfunction metal sufficiently thin to be transparent in contact with the electroluminescent layer. Preferred low workfunction materials have a workfunction of no more than 3.5 eV, preferably no more than 3.2 eV, most preferably no more than 3.0 eV. Alkaline earth metals having these workfunctions in this range, in particular barium or calcium, are particularly preferred. Thin low workfunction materials may be deposited by relatively low energy processes such as thermal or electron beam evaporation that do not cause any damage to electroluminescent layer 8. a thin layer of dielectric material capped with a thin metal layer. Preferred dielectric materials are metal oxides or fluorides, preferably fluorides. Preferred metal cations are alkaline or alkaline earth metals. Particularly preferred are fluorides of lithium, sodium, calcium and barium. Any thin metal layer may serve to cap the dielectric layer provided it retains its transparency, for example aluminium.

The transparent cathode is typically capped with a further layer. This is because OLEDs are prone to degradation in the presence of moisture and oxygen and it is therefore desirable to provide a transparent encapsulant over the transparent cathode to provide a barrier against ingress of moisture and oxygen. Suitable transparent encapsulants include a layer of glass glued onto substrate or a barrier stack comprising alternating layers of plastic and ceramic materials that combine form a tortuous path for moisture or oxygen ingress.

Embodiments of the present invention have several benefits. Multiple anode layers can be deposited and automatically patterned without alignment problems. This is because the anodes are deposited after the first bank layer which defines electrode areas as opposed to being deposited prior to depositing the banks. Because the anodes are deposited after the banks under vacuum during device manufacture, as opposed to being formed on the substrate prior to device manufacture, damage from reaction of the anode material with oxygen and water prior to device manufacture is avoided.

Deposition of the anode material automatically forms the bus-bars in a single step. The bus-bars provide continuous conductive lines across the entire display increasing the conductivity of the thin transparent cathode. Addition of cathode bus-bars to increase conductivity normally has a significant impact on the maximum aspect ratio. In contrast, the present method of providing bus-bars has no impact on the aspect ratio of the resulting device. The bus-bars are formed only on the banks and via holes are provided to connect the cathode to each bus-bar. In practice the bus-bars merge to form a sheet or layer as illustrated in FIG. 4B (discussed below) with holes in the layer corresponding to positions of the emissive pixels.

Figure 4:
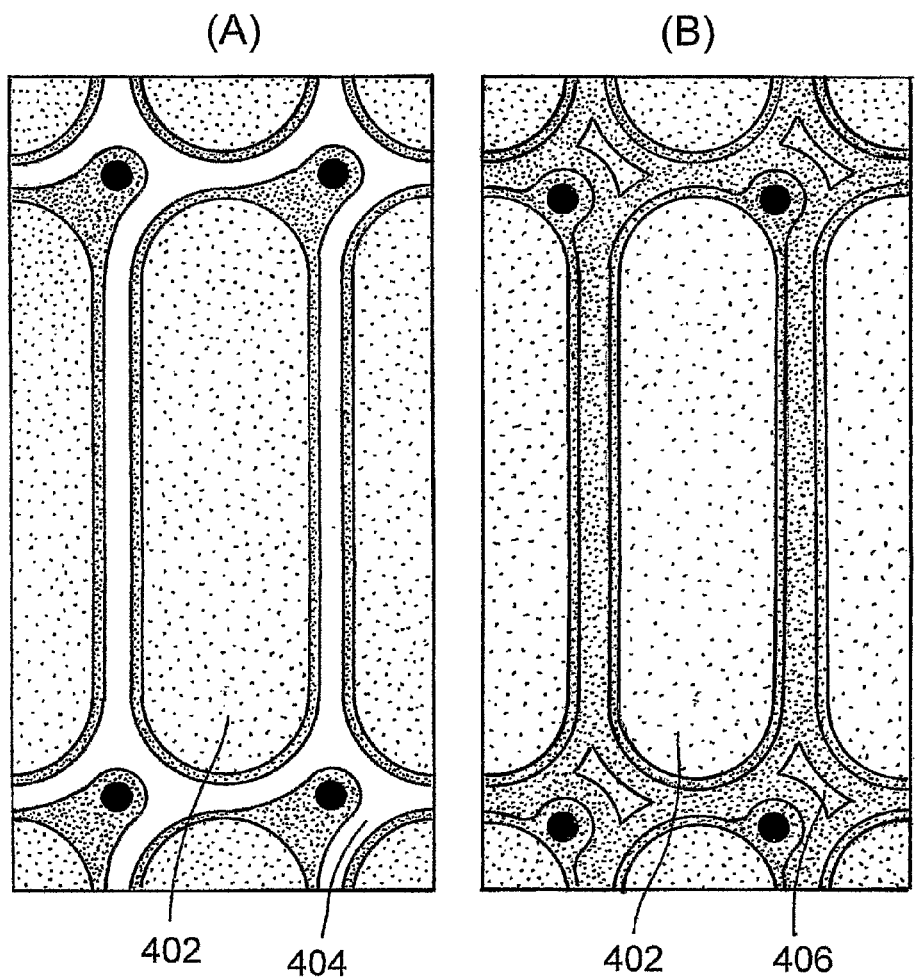

The lack of impact on the aspect ratio of a device can be seen by comparing a device without bus-bars (FIG. 4A) with a device which has bus-bars in accordance with an embodiment of the present invention (FIG. 4B). In FIGS. 4A and 4B, a top view of an electroluminescent display comprising emissive pixels 402 is shown. Non-emissive regions 404 in FIG. 4A correspond to regions where the bank material defining the pixel wells is disposed. In FIG. 4B, bus-bars 406 are provided only in the non-emissive regions such that there is no impact on the aspect ratio of the display.

While this invention has been particularly shown and described with reference to preferred embodiments thereof, it will be understood by those skilled in the art that various changes in form and details may be made therein without departing from the scope of the invention as defined by the appended claims.

The invention claimed is:

1. A method for manufacturing an organic semiconductor device having a plurality of pixels, said method comprising: providing a substrate comprising a patterned layer of well-defining banks; depositing a first conductive material in the wells and over the well-defining banks, the first conductive material forming first electrodes in the wells and bus-bars over the well-defining banks with an electrical break therebetween; depositing an organic semiconductive layer over the first electrodes in the wells; and depositing a second conductive material over both the organic semiconductive layer and the bus-bars forming a continuous second electrode over the organic semiconductive layer and the bus-bars.

2. A method according to claim 1, wherein the patterned layer of well-defining banks comprises a double bank structure including a first bank which has an undercut structure and a second bank having a positive profile, the bus-bars being disposed between the first and second banks.

3. A method according to claim 1, wherein the patterned layer of well-defining banks is formed from a photoresist patterned using a photomask or from an etchable material patterned by a wet etch or a dry etch process.

4. A method according to claim 1, wherein the patterned layer of well-defining banks is at least 1.5 times as thick as the first electrodes.

5. A method according to claim 4, wherein the patterned layer of well-defining banks is at least 2 times as thick as the first electrodes.

6. A method according to claim 4, wherein the patterned layer of well-defining banks is less than 30 times as thick as the first electrode.

7. A method according to claim 1, wherein the first conductive material is a metal, an alloy, or a conductive oxide.

8. A method according to claim 1, wherein the first electrodes are reflective and the second electrode is transparent.

9. A method according to claim 1, wherein the first electrodes are anodes and the second electrode is a cathode.

10. A method according to claim 1, wherein the organic semiconductive material is deposited by inkjet printing.

11. An organic semiconductor device having a plurality of pixels, said device comprising: a substrate comprising a patterned layer of well-defining banks; a layer of first conductive material in the wells and over the well-defining banks, the first conductive material forming first electrodes in the wells and bus-bars over the well-defining banks with an electrical break therebetween; an organic semiconductive layer over the first electrodes in the wells; and a layer of second conductive material over both the organic semiconductive layer and the bus-bars, the second conductive material forming a continuous second electrode over the organic semiconductive layer and the bus-bars.

12. An organic semiconductor device according to claim 11, wherein the patterned layer of well-defining banks comprises a double bank structure including a first bank which has an undercut structure and a second bank having a positive profile, the bus-bars being disposed between the first and second banks.

13. An organic semiconductor device according to claim 11, wherein the patterned layer of well-defining banks is formed from a photoresist material.

14. An organic semiconductor device according to claim 11, wherein the patterned layer of well-defining banks is at least 1.5 times as thick as the first electrodes.

15. An organic semiconductor device according to claim 14, wherein the patterned layer of well-defining banks is at least 2 times as thick as the first electrodes.

16. An organic semiconductor device according to claim 14, wherein the patterned layer of well-defining banks is less than 30 times as thick as the first electrodes.

17. An organic semiconductor device according to claim 11, wherein the first conductive material is a metal, an alloy, or a conductive oxide.

18. An organic semiconductor device according to claim 11, wherein the first electrodes are reflective and the second electrode is transparent.

19. An organic semiconductor device according to claim 11, wherein the first electrodes are anodes and the second electrode is a cathode.

20. An organic semiconductor device according to claim 11, wherein the organic semiconductive material is depositable by inkjet printing.

21. An organic semiconductor device according to claim 11, wherein no first conductive material is disposed under the patterned layer of well-defining banks.

22. An organic semiconductor device according to claim 12, wherein no first conductive material is disposed under the first bank.

23. An organic semiconductor device according to claim 11, wherein the patterned layer of well-defining banks defines areas in which the first conductive material is disposed forming the first electrodes.

* * * * *